United States Patent [19]

Sandner

[11] Patent Number: 5,227,826
[45] Date of Patent: Jul. 13, 1993

[54] LAYER TRANSFER PROCESS FOR IMAGE PRODUCTION AND APPARATUS TO PREFORM THE PROCESS

[75] Inventor: Helmut G. Sandner, Rodgau, Fed. Rep. of Germany

[73] Assignee: E. I. Du Pont de Nemours and Company, Wilmington, Del.

[21] Appl. No.: 820,522

[22] Filed: Jan. 14, 1992

Related U.S. Application Data

[62] Division of Ser. No. 606,797, Oct. 31, 1990, Pat. No. 5,155,010.

[30] Foreign Application Priority Data

Dec. 23, 1989 [DE] Fed. Rep. of Germany ....... 3942816

[51] Int. Cl.⁵ .................................................. G03D 5/00
[52] U.S. Cl. ........................................ 354/301; 355/27
[58] Field of Search ............... 354/85, 86, 301, 303, 354/304; 355/27; 430/291, 269, 292, 293, 253

[56] References Cited

U.S. PATENT DOCUMENTS

| 4,304,839 | 12/1981 | Cohen et al. ............... 430/253 |
| 4,356,253 | 10/1982 | Buzzell ........................ 430/291 |
| 4,764,451 | 8/1988 | Ishikawa .................... 430/253 |
| 4,806,451 | 2/1989 | Frohlich ...................... 430/291 |
| 4,827,312 | 5/1989 | Ogiwara et al. ............. 355/27 |
| 4,902,363 | 2/1990 | Delaney et al. ............ 156/230 |
| 4,912,014 | 3/1990 | Feldman ..................... 430/291 |
| 4,945,381 | 7/1990 | Yamagata et al. ........... 355/27 |

FOREIGN PATENT DOCUMENTS

| 0243933 | 4/1987 | European Pat. Off. . |
| 0338828 | 10/1989 | European Pat. Off. . |
| 2213950 | 8/1989 | United Kingdom . |

Primary Examiner—A. A. Mathews

[57] ABSTRACT

Layer transfer process for image production wherein predetermined areas of the surface of an image carrier (21) are prepared to accept a color layer, the image carrier (21) and a color carrier (22) of layer transfer material are brought into mutual contact under pressure, and the color carrier is removed from the image carrier, so that color remains on the predetermined areas of the image carrier. A high uniformity of colorant application can be achieved over the entire surface of the image carrier. The process is performed by an apparatus with at least one roll nip (31) formed by two hard rolls (11, 12), preferably with different diameters, in which the two rolls are mutually offset relative to the feed direction (30) of the image carrier (21).

15 Claims, 5 Drawing Sheets

5,227,826

LAYER TRANSFER PROCESS FOR IMAGE PRODUCTION AND APPARATUS TO PREFORM THE PROCESS

This is a division of application Ser. No. 07/606,797, filed Oct. 31, 1990, now U.S. Pat. No. 5,155,010.

FIELD OF THE INVENTION

The invention relates to layer transfer process for image production. The invention also relates to a apparatus to perform the process, the apparatus having at least one roll nip formed by two rolls.

BACKGROUND OF THE INVENTION

Layer transfer materials and processes are known and have many uses in the electronics industry, for example, to make photoresist masks and solder masks, and in the printing industry, for example, to make color reproductions and for proofing color separations. In color proofing processes, light-sensitive layer transfer materials (for example, those of U.S. Pat. No. 4,356,253 and European Patent 243 933 A) are used to make image carriers, and light-insensitive transfer materials are used as color carriers, as disclosed in Fröhlich U.S. Pat. No. 4,806,451 or Delaney et al. U.S. Pat. No. 4,902,363.

To prepare for applying colorant onto an image carrier, the surface of the image carrier is exposed in the usual manner, for example, with a light source emitting its light through a negative or a positive onto the image carrier or with a controlled laser beam. The exposed and unexposed areas differ in their ability to accept colorant from a color carrier brought into contact with and then removed from the image carrier. Particularly, in proofing color separations in the printing industry, the color transfer must produce the same quality as in printing. In color printing, which is usually with four colors, each color is not applied areawise, but rather in the form of small dots. The original is screened for this purpose, so that the color dots appear on the image carrier in a regular halftone screen format. The intensity of each color is determined by the size of the color dots. Standard specifications, for example, for a high quality offset print, require a resolution of 2% to 98% dots for a halftone screen width of 60 lines/cm. In this case, it is particularly difficult to achieve satisfactory resolution of the pointy 2% dots in the highlights and of the 98% dots in the shadows. These 2% dots have a diameter of about 27 μm. For good tonal value reproduction, it is also of considerable importance that halftone dots of the same size be sharply defined and uniform over the entire surface area, that is, reproduced without size variations. To achieve satisfactory quality of image reproduction, the colorant must adhere on the image carrier in all areas where colorant is applied. This is especially difficult with small color dots. If very small color dots are missing, this leads to flaws on the image carrier, which distorts the tonal value accuracy of the reproduction.

The invention concerns a layer transfer process for image production, a process with which high uniformity of halftone values can be achieved over the entire surface.

In the case of a layer transfer process of the above-described type, the problem is solved in accordance with the invention by having the contact made at such high pressure that image carrier and/or color carrier are compressed together at least temporarily on mutual facing surfaces so that the sum of the compression depths corresponds to at least the sum of the local peak-to-valley distances of the surface microstructures.

Although the surfaces of image carriers and color carriers feel relatively smooth, closer inspection of the surfaces shows that the surface roughness is relatively high in proportion to the color layer to be applied. At high magnification, the surfaces of image carriers and color carriers look like mountain ranges, wherein the differences between peaks and valleys can reach an order of magnitude of about 10 to 50 μm. During the color transfer, two "valleys" of image carrier and color carrier could lie opposite each other. Consequently, the color in the valley of the color carrier is brought into contact with the image carrier only with light pressure or even without pressure. In an extreme case, there is no contact at all at this site. When the color carrier is removed, the color adheres unsatisfactorily or not at all to the image carrier and produces a flaw. In accordance with the invention, this problem is overcome by the color carrier and image carrier being compressed together with a pressure so high that the their surface structures mutually adapt. Depending on the hardness of the materials used, protrusions on the color carrier are pressed on the surface of the image carrier long enough to reach a state wherein the surfaces of the color carrier and the image carrier are in complete contact. Naturally, the image carrier might be hardened in the area where its surface is compressed, so that it becomes harder than the color carrier. With an increase in pressure, the color carrier is also compressed, so that, ultimately in each case, the two surfaces of image carrier and color carrier lie completely on each other, that is, are in contact on each dot, practically speaking. Thus, the color of the color carrier is pressed more evenly onto the image carrier. Consequently, the color deposit on the image carrier is more uniform. In this process, the local peak-to-valley distance is a measure of the difference in height between adjoining "peaks" and "valleys" on the surface of image carriers or color carriers.

Until now, it was considered impossible to accomplish a layer transfer process for image production with such high pressure. Such high pressure, it was feared, would flaw registration. This would make repetitive performance of the process impossible, for example, for the production of four-color prints, because the individual colors could not be positioned accurately. Furthermore, it was feared that such high pressure would cause dot growth, distorting the reproduction of the original. It has now been shown that these concerns are groundless.

SUMMARY OF THE INVENTION

In accordance with this invention there is provided a layer transfer process for image production, in which predetermined areas of the surface of an image carrier are prepared to accept a color layer from a color carrier, the image carrier and a color carrier are brought into contact with each other under a high enough pressure that the image carrier and/or color carrier are compressed at least temporarily on their mutually facing surfaces containing peaks and valleys so that the sum of the compression depths corresponds to at least the sum of the local peak-to-valley distances of the color carrier and image carrier, and the color carrier is removed from the image carrier so that color remains on the predetermined areas of the image carrier.

DESCRIPTION OF THE DRAWINGS

In the accompanying figures forming a material part of this disclosure wherein.

DETAILED DESCRIPTION OF THE INVENTION

Figure 1A:
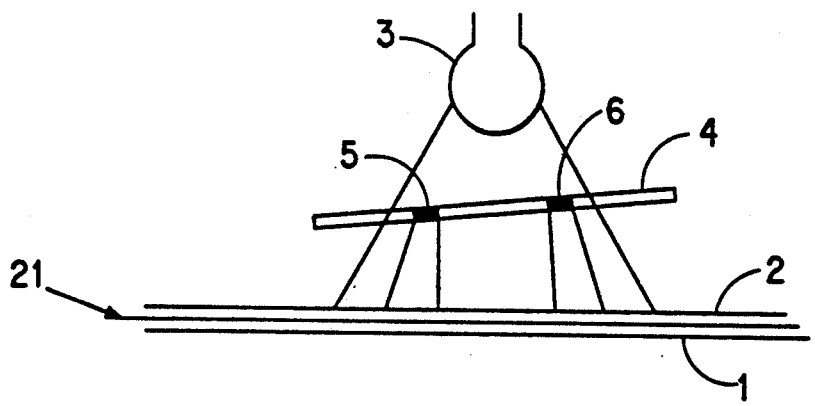
FIG. 1 is a schematic view of the process.
Figure 1B:
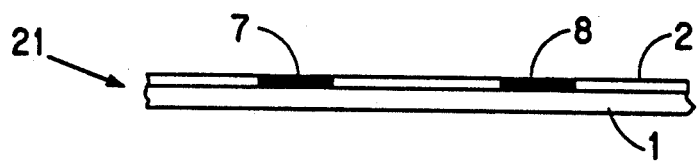
Figure 1C:
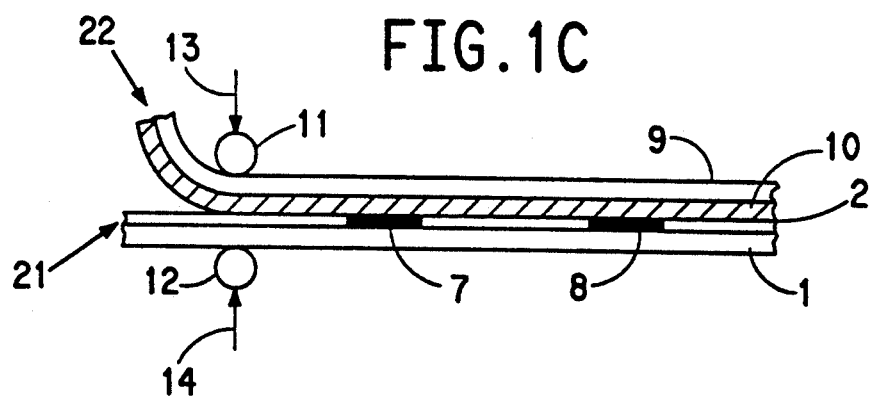
Figure 1D:
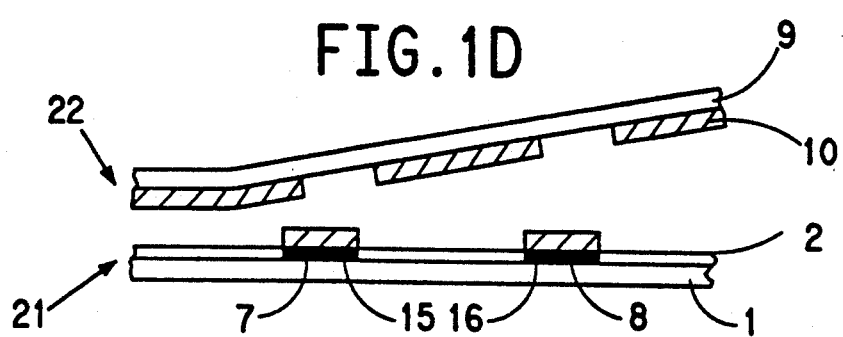

The image carrier is advantageously compressed on the surface facing the color carrier by at least approximately the sum of the peak-to-valley distances of color carrier and image carrier. This produces the fewest problems with exact alignment of the image carrier. The force necessary to produce the pressure can be lower, because the color carrier generally resists the application of pressure less than the image carrier. Thus, pressure can operate through the color carrier on the surface of the image carrier more easily than through the image carrier itself.

In another embodiment of the process involving an image carrier on a base, the magnitude of the pressure is controlled so that the base is only elastically deformed. This assures that registration is maintained in each case. The areas prepared for color recording are shifted relative to each other only temporarily, if at all, so that another color separation can be applied on the same image carrier.

In a preferred embodiment, the pressure is produced in a band that is narrower than its length and is positioned continuously off-center parallelwise over the color carrier and image carrier. Whenever pressure is produced on a small area, only a comparatively low force is required. A brief application of pressure suffices to achieve good color transfer from the color carrier onto the image carrier.

It is advantageous to bring the image carrier and color carrier into mutual contact without heat. Thus, processing can be accomplished at room temperature. In known processes, image carrier and/or color carrier were generally heated, either by preheating or by heated rolls applying pressure. This was to attempt to optimize the properties of color carriers and image carriers to achieve flawless color transfer. This is not necessary in the preferred embodiment, because color application can be equalized by the reduction in surface roughness.

In a particularly preferred embodiment of the invention, image carrier and color carrier are brought into mutual contact just immediately before the application of pressure. This largely reduces the risk of colorant being transferred from the color carrier onto the image carrier by undesired contact or friction between color carrier and image carrier. This excludes premature removal of colorant, which later is to be transferred to the image carrier, from an area of the color carrier, if this area of the color carrier is brought into contact with an area of the image carrier prepared to accept colorant.

It is advantageous to apply a photosensitive layer on the base of the image carrier to prepare the surface and then to expose the image carrier by an image production apparatus. As mentioned, the image production apparatus can be a light source that transmits its rays through a negative or a positive (depending on the properties of the photosensitive layer). The surface properties of the portions of the image carrier not covered by the black portions of the negative or the positive, that is, the exposed portions, are changed; for example, they lose the capability of causing colors from the color carrier to adhere. It is useful to apply the photosensitive layer by lamination, a process that has proved successful.

The tackiness of the surface of the image carrier is modified advantageously by exposure in the exposed areas or in accordance with the process of U.S. Pat. No. 4,304,839, in the unexposed areas, the disclosure of which is incorporated herein by reference. The color can then adhere to the areas remaining tacky, whereas it can be peeled away from the non-tacky areas. For this purpose, it is preferable that the surface be photopolymerized by the exposure in the exposed areas. The invention is not limited to use of this and other elements described herein for the image carrier as many other photohardenable or photopolymerizable elements can be used as the image carrier.

An apparatus to perform the above-described process is characterized in that the roll nip is formed by two hard rolls, e.g., metal. With the two hard rolls, a significantly higher pressure can be attained in the nip than was possible until now in roll nips with a hard roll and a soft roll.

Preferably, the two rolls have different diameters. A higher pressure increase can be achieved in the roll nip with the combination of two rolls with different diameters. The smaller the roll diameter, the higher is the resulting compression. On the other hand, there is the risk that, with a small roll diameter, the roll might bend and not be able to produce the same pressure overall in the roll nip. For this reason, a smaller roll is combined with a larger roll to enhance mechanical stability.

It is also advantageous for both rolls to be offset from each other in the feed direction of the image carrier. It has been shown that this configuration decreases considerably the risk of crease formation. Furthermore, offsetting the two rolls relative to the travel direction of the image carrier permits generating a somewhat higher pressure in the roll nip from the same external force. A type of wedge action is produced.

The roll in contact with the color carrier should have a smaller diameter than the roll in contact with the image carrier. As a rule, the color carrier is more flexible than the image carrier. The pressure exerted on the contact surfaces between color carrier and image carrier is, therefore, not distributed or is only distributed to a lesser extent over a larger surface by the flexibility of the color carrier. The high pressure can thus be concentrated directly on the color carrier, so that the color is bonded intimately and uniformly with the predetermined areas of the image carrier.

It is advantageous for the wrap angle of the color carrier around its assigned roll to be greater than the wrap angle of the image carrier around the same roll. The term "wrap angle" means, in each case, the region of the roll circumference in which the color carrier or image carrier rests directly or indirectly on the roll. In this manner, the color carrier and image carrier come into mutual contact, practically speaking, just immediately before entering the roll nip.

In a preferred embodiment, both rolls are reinforced lengthwise perpendicularly to the direction of travel by a bracing device for each, whereby pressure can be applied, in particular pneumatically, on at least one bracing device. At a certain length/diameter ratio for the rolls, the roll nip becomes unacceptably deformed due to roll bending. The nip is larger in the middle than on both ends. This can result in the pressure distribution in the roll nip being at a minimum in the middle. Even if this minimum pressure were still adequate to decrease surface roughness, there is still the risk that, due to the increased pressure at the ends of the roll nip, the color carrier and the image carrier would accelerate in the middle of the roll nip and a crease would form there. The bracing device makes it possible to maintain uniform pressure in the nip between the two rolls over the entire width of the roll nip. The pressure there can be raised to very high values without the risk of crease formation in the material (color carrier and image carrier) being processed.

It is advantageous for each bracing device to have bearing elements that engage the surface of the related roll. External bracing is the simplest form. It can be easily mounted. Furthermore, there is adequate space available for an apparatus to produce pressure.

The bearing elements are preferably shaped as rolling bearings, particularly ball bearings, whose outer rings, optionally under or enclosed by an intermediate spacer ring, ride on the surface of the roll. This rolling action avoids grooving the roll surface, which could lead to uneven pressure in the roll nip.

It is advantageous for each bracing device to accept forces parallel to the feed direction. As both rolls are mutually offset with respect to feed direction, pressure applied perpendicularly to the feed direction also creates forces parallel to the feed direction. The bracing device can also accommodate these forces in order to fulfill its objective reliably to prevent a widening of the nip in its middle.

It is also preferable for the bracing device on the rolls to be self-centering. The rolls are then automatically maintained in the desired position.

It is advantageous for the bearing elements to engage the roll surface on both sides of a plane perpendicular to the feed direction and running through the roll axis. The bearing elements can thus be assembled symmetrically. This simplifies installation and supply maintenance.

The invention is described in the following text with the aid of a preferred embodiment in connection with the drawings. To produce the image, as noted in FIG. 1, an image carrier 21, which has a base 1 provided with a photosensitive layer 2, such as a photohardenable or photopolymerizable layer, is exposed by a light source 3 through a negative 4 of an original. The negative 4 has black areas 5, 6 through which light from the light source 3 cannot pass to the photosensitive layer 2. The photosensitive layer 2 is made preferably of a photopolymerizable material that is tacky at least on the surface. The tackiness is adequate to permit a colorant, e.g., pigment or dye particles, to adhere. The exposure polymerizes the material, whereupon it loses its tackiness, but only in the exposed areas. Due to the black areas 5, 6 of the negative 4, which covered the photosensitive layer 2 during the exposure, layer 2 has unexposed areas 7, 8 (FIG. 11B) that are still tacky. In the next step, c) of FIG. 1, a color carrier 22, consisting essentially of a base 9 and a color layer 10 applied on its underside, is brought into contact with layer 2 of the image carrier 21. For this purpose, color carrier 22 and image carrier 21 are fed together through a nip formed by two rolls 11, 12, both rolls being subjected to forces 13, 14. Colorant from color layer 10 of color carrier 22 adheres on the layer 2 areas 7, 8 remaining unexposed and hence, tacky. When the color carrier 22 is peeled off the image carrier 21, the adhesion of colorant to the tacky areas 7, 8 of the image carrier is greater than to the color carrier 22, so that color dots 15, 16 remain on the tacky areas 7, 8, d) of FIG. 1. Peeling the color carrier 22 off the image carrier 21 produces an image corresponding to a positive separation of the original. Preferred materials used for this process are, for preparing the image carrier, those described in Buzzell U.S. Pat. No. 4,356,253 and European Patent 243 933 A and for the color carrier, those disclosed in Fröhlich U.S. Pat. No. 4,806,451 or Delaney et al. U.S. Pat. No. 4,902,363.

Figure 2:
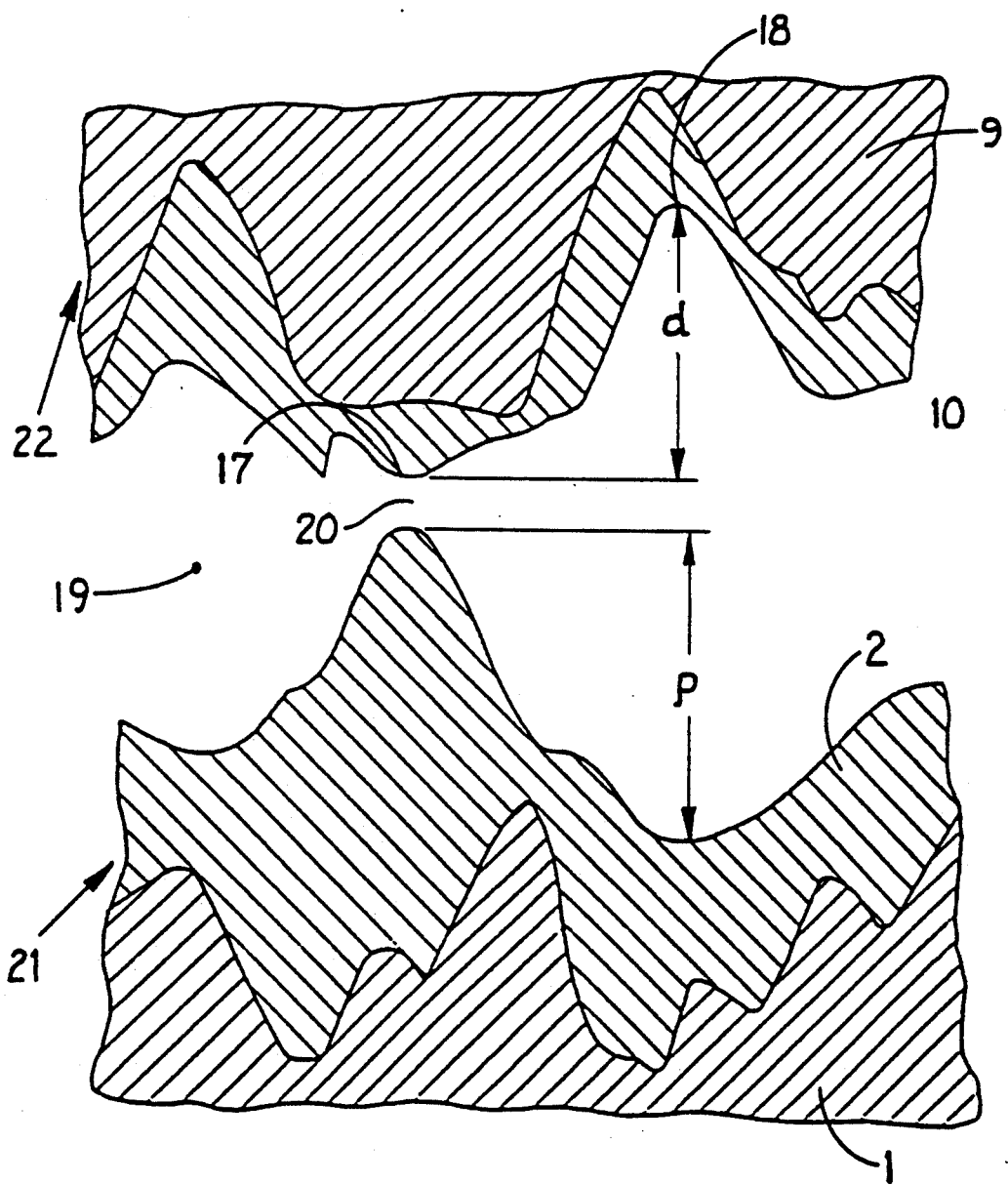
FIG. 2 is a cross-section view through a color carrier and an image carrier.

FIG. 2 shows a highly enlarged segment of a cross-section of image carrier 21 and color carrier 22. The surfaces of image carrier 21 and color carrier 22 are not smooth. Rather, they show comparatively high local roughness relative to the color layer 10. The roughness or peak-to-valley distance is a measure of the height difference d between adjoining "peaks" 17 and "valleys" 18. The surface roughness of the image carrier 21 is determined in a similar manner by the height difference p between adjoining peaks and valleys. It is easy to see that, in one area 19, where the two valleys of image carrier 21 and color carrier 22 are opposite each other, a lower pressure builds up than in area 20, where two peaks of color carrier 22 and image carrier 21 are opposite each other. Whereas the color transfer would be satisfactory in area 20, it is possible that, in area 19, a lower quality transfer occurs due to the lower pressure, or transfer does not occur due to a lack of contact.

In the passage through the roll nip between the rolls 11 and 12, a sufficiently high pressure is now exerted on the combined layers of color carrier and image carrier that the surface structures of color carrier and image carrier adjust to each other. In so doing, at least one surface, possibly also both, will yield and adapt to the other. In this adaptation, both carriers 21, 22 are compressed on the surface, specifically by the sum of the peak-to-valley distances, that is, by the amount d+p. In this action, the one surface can accept almost the entire compression depth, the other, on the other hand, practically none. The extent of the compression distribution is not necessarily dependant on the prior roughness.

Figure 3:
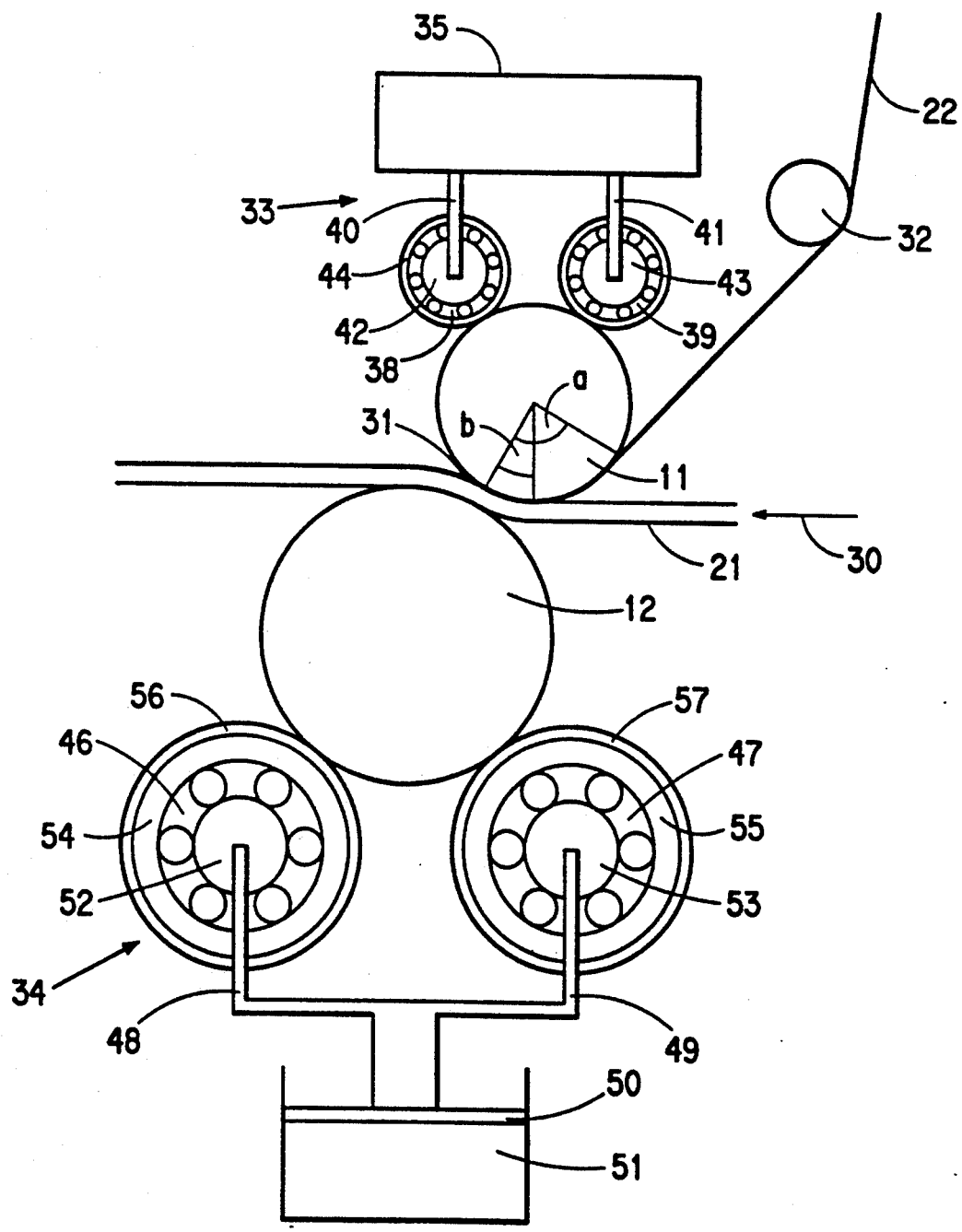
FIG. 3 is a schematic side view of an apparatus.
Figure 4:
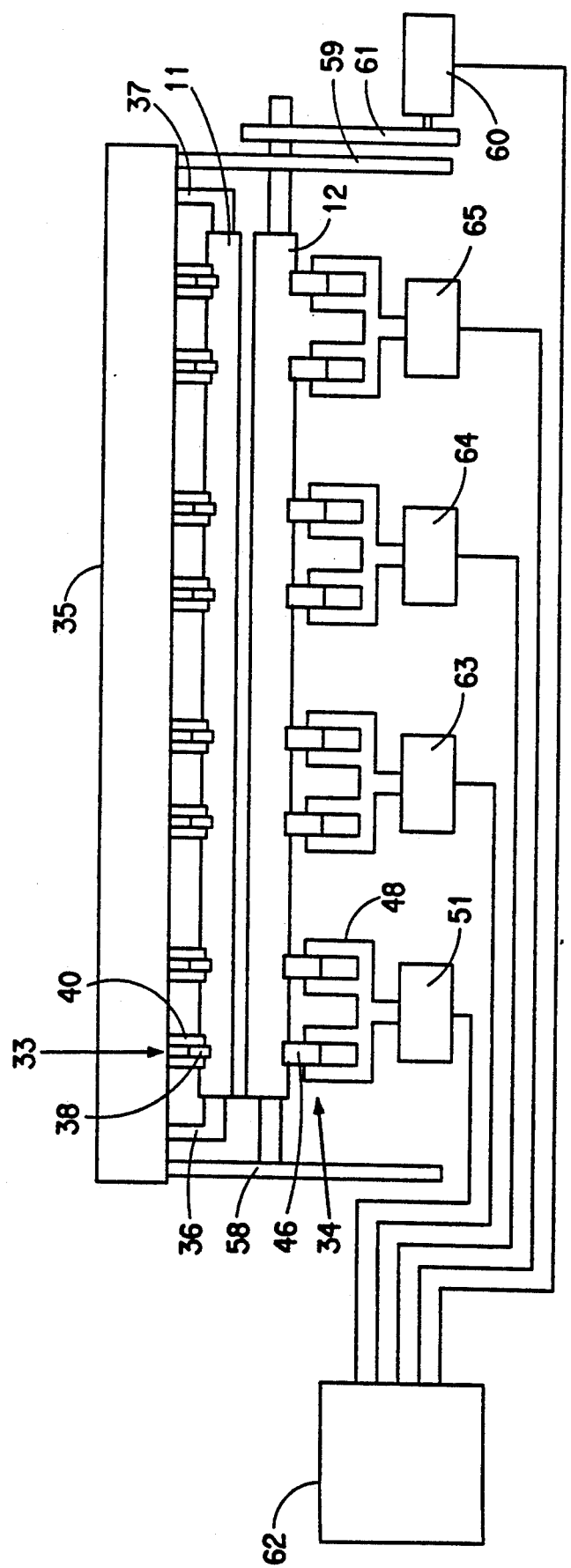
FIG. 4 is a front view of an apparatus for performing the process.

FIGS. 3 and 4 show a device to apply pressure. The image carrier 21 is fed in the direction of the arrow 30 (feed direction) into the roll nip formed between the rolls 11 and 12. The color carrier 22 is passed over a guide roll 32 to roll 11. Because the color carrier 22 has a larger wrap angle a around the roll 11 than the image carrier 21 has with its wrap angle b around the same roll 11, color carrier 22 and image carrier 21 come into contact with each other just shortly before the roll nip. This prevents creases produced by small grinding movements that can be caused, for example, by the vibrations in the apparatus. This also prevents premature contact with the tacky areas of the image carrier and pickup from the color carrier of colorant that would then be missing where it should actually have been applied on the areas of the image carrier provided for it.

To prevent both rolls from warping under the pressure applied in the roll nip 31 and adversely affecting pressure distribution in the roll nip 31, both rolls 11, 12 are reinforced over their length with the aid of bracing devices 33, 34. The bracing device 33 for the upper roll 11 is rigidly attached to a beam 35, that also supports bearing arms 36, 37 (FIG. 4) for the roll 11. The bracing device 33 consists of, for example, a row of ball bearings 38, 39 positioned parallel to each other along the length of the roll 11; the inner rings 42, 43 are attached to the beam 35 with the aid of brackets 40, 41. Their outer rings 44, 45 ride on the surface of the roll 11. The two ball bearings 38, 39 are positioned on both sides of a plane that runs perpendicularly to the feed direction 30 through the center axis of the roll 11. Thus, the bracing device 33 is not only able to accept forces perpendicular to the feed direction, but also forces parallel thereto. Naturally, other rolling bearings or sliding bearings can be used.

The bracing device 34 has, on both sides of a plane running perpendicularly to the feed direction 30 through the middle axis of the roll 12, in each instance, for example, a ball bearing 46, 47 connected through brackets 48, 49, in each instance, with a piston 50 of pneumatic or hydraulic pressure production devices 51, 63, 64, 65. The inner rings 52, 53 are attached directly to the brackets 48, 49, whereas the outer rings of the ball bearing 46, 47 can be encircled by an intermediate ring 56, 57 that then rides on the surface of the roll 12. The roll 12 is supported, as shown in FIG. 4, in bearing blocks 58, 59 that can be moved in the direction of the output from the pressure production devices 51, 63, 64, 65 and is driven by a motor 60 through a suitable transfer device 61, for example, a drive belt. The bearing blocks 58, 59 also support the beam 35. Thus, the pressure produced by the pressure production devices acts from above and below on the nip 31. The rotation rate of the motor 60 and the pressure generation by the pressure production devices 51, 63, 64, 65 are regulated by a control device 62. As a rule, higher pressure is produced by the middle pressure production devices 63, 64 than by the outer pressure production devices 51, 65, in order to assure uniform pressure distribution over the entire width of the roll nip. The bracing devices 33, 34 are self-centering on the roll in each case.

As is evident particularly in FIG. 3, both rolls 11, 12 have different diameters. The roll 11 coming into contact with the color carrier 22 has a smaller diameter than the roll 12 coming into contact with the image carrier 21. The smaller the roll 11, the greater is the pressure that can be produced in the roll nip by the same force. The usual measurements for the diameter of the smaller roll are in the range between 10 and 100 mm, preferably at 30 mm. Typical diameter values for the larger roll are greater than 20 mm, preferably about 70 mm. In an extreme case, the lower roll 12 can also be replaced by a flat plate. This case involves a roll with infinite diameter. The offset of the axes of the two rolls in the feed direction runs in the range between about 0.1 and 5 mm. The offset reduces substantially the danger of crease formation in the passage of the color carrier and image carrier.

Figure 5:
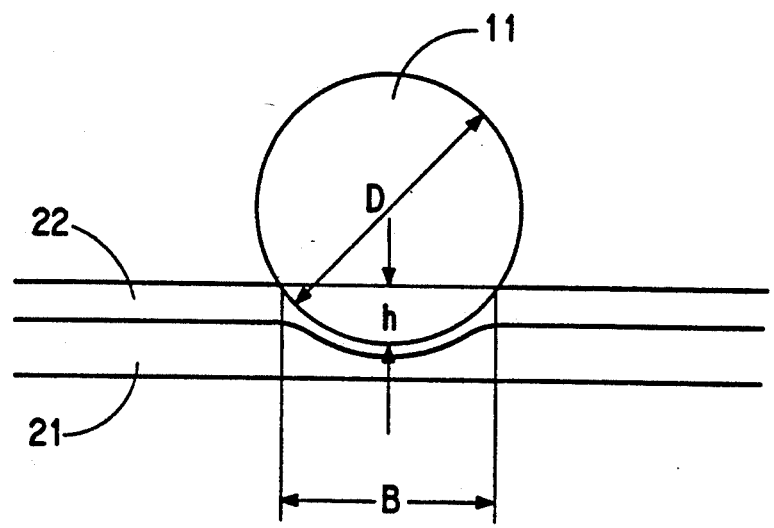
FIG. 5 is a schematic representation of the determination of compression depth.
Figure 6:
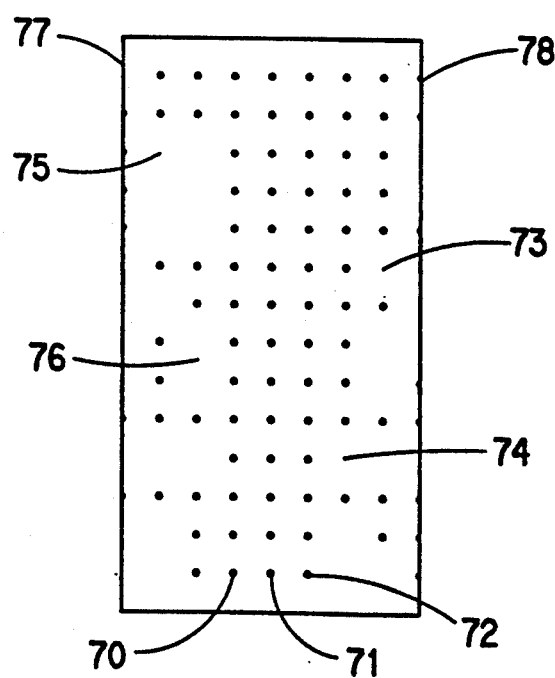
FIG. 6 is a dot screen.

FIG. 5 shows schematically a process for determining compression depth h. Here, the depth h is exaggerated. The roll 11 with the diameter D is put under pressure by the pressure production devices 51, 63-65 (FIG. 4), so that the image carrier 21 and color carrier 22 cannot pass through the roll nip. The image carrier 21 was prepared in advance to have a regular halftone screen of tacky 2% dots on its surface (FIG. 6). The screen has 60 lines/cm, so that the individual dots have a diameter of 27 μm. If the pressure is sufficiently high, the middle section contains at least one, preferably three rows 70–72, in which all dots are satisfactorily provided with color. Thus, there are no blank spaces on which there has been no color transfer. The farther away, the more uneven is the color transfer, that is, blank sites 73–76 accumulate. Outside the two rows of dots 77, 78, no color transfer actually took place, that is, image carrier 21 and color carrier 22 were not entirely compressed together in this area. From the width B, that is, the distance between the two rows of dots 77, 78 and the diameter D of the roll 11, the compression depth h can be determined according to the following formula:

$$h = (D - \sqrt{D^2 - B^2})/2$$

In one test, in which the support 1 of the image carrier 21 was a NW paper from Papierfabrik Schoeller, onto which a Cromalin ® C4/CP8Bx, E. I. du Pont de Nemours and Company, Wilmington, Del. was laminated and which was brought into contact with a color carrier in accordance with Delaney et al., U.S. Pat. No. 4,902,363 (Example 1d), the result was a spacing B of 2.4 mm between the two rows of dots 77 and 78. The diameter D of the roll 11 was 30 mm, and the diameter of the other roll 12 was 70 mm. From this was calculated a compression depth of 50 μm.

I claim:

1. An apparatus to perform a layer transfer process for image production, wherein an image carrier comprising a photohardenable layer on a support is exposed to light to modify the surface tackiness of the photohardenable layer in predetermined areas to accept a color layer from a color carrier, the image carrier and color carrier are brought into contact with each other under a high enough pressure that the image carrier and/or color carrier are compressed at least temporarily on their mutually facing surfaces containing peaks and valleys so that the sum of the compression depths equals at least the sum of the local peak-to-valley distances of the color carrier and image carrier, and the color carrier is removed from the image carrier so that color remains on the predetermined areas of the image carrier; wherein the apparatus comprises at least one roll nip formed by two rolls, the roll nip being formed by two hard rolls of different diameters, wherein said rolls are mutually offset relative to the feed direction of the image carrier, wherein the wrap angle of the color carrier around the associated roll is greater than the wrap angle of the image carrier around the same roll, wherein both rolls are each reinforced over their length perpendicularly to the feed direction by a bracing device and wherein pressure can be applied pneumatically on at least one bracing device.

2. An apparatus for use in transferring a color layer from a color carrier to an image carrier having imagewise modified tacky areas on a surface thereof, said apparatus comprising:
   a) at least one roll nip formed by two hard rolls, one of said rolls being in wrapped engagement with the color carrier and the other roll being in wrapped engagement with the image carrier, wherein said image carrier comprises a photohardenable layer on a support which has been imagewise exposed to light to modify the surface tackiness of the photohardenable layer in predetermined areas; and b) means for effecting pressure at said at least one roll nip such that the color carrier and/or image carrier are compressed at least temporarily on their mutually facing surfaces containing peaks and valleys so that the sum of the compression depths equals at least the sum of the local peak-to-valley distances of the color carrier and image carrier, whereby upon removal of the color carrier from the image carrier, color remains on the predetermined areas of the image carrier.

3. An apparatus according to claim 2 wherein the two rolls have different diameters.

4. An apparatus according to claim 3 wherein the two rolls are mutually offset relative to the feed direction of the image carrier.

5. An apparatus according to claim 3 wherein the roll in contact with the color carrier has a smaller diameter than the roll in contact with the image carrier.

6. An apparatus according to claim 4 wherein the roll in contact with the color carrier has a smaller diameter than the roll in contact with the image carrier.

7. An apparatus according to claim 4 wherein the wrap angle of the color carrier around the associated roll is greater than the wrap angle of the image carrier around the same roll.

8. An apparatus according to claim 7 wherein both rolls are each reinforced over their length perpendicularly to the feed direction by a bracing device and wherein pressure can be applied on at least one bracing device.

9. An apparatus according to claim 8 wherein the pressure is applied pneumatically.

10. An apparatus according to claim 8 wherein each bracing device has bearing elements that engage the surface of the associated roll.

11. An apparatus according to claim 10 wherein the bearing elements are formed of rolling bearings whose outer rings ride on the roll surface.

12. An apparatus according to claim 11 wherein the outer rings are each enclosed by an intermediate ring.

13. An apparatus according to any of claim 8 wherein each bracing device accommodates forces essentially parallel to the feed direction.

14. An apparatus according to claim 8 wherein the bracing devices are self-centering on the rolls.

15. An apparatus according to claim 10 wherein the bearing elements engage the roll surface on both sides of a plane running perpendicularly to the feed direction through the roll axis.

* * * * *